United States Patent [19]

Stevenson

[11] 4,389,274
[45] Jun. 21, 1983

[54] ELECTROCHEMICAL DEOXYGENATION FOR LIQUID PHASE EPITAXIAL GROWTH

[75] Inventor: David A. Stevenson, Los Altos Hills, Calif.

[73] Assignee: The United States of America as represented by the Secretary of the Navy, Washington, D.C.

[21] Appl. No.: 246,529

[22] Filed: Mar. 23, 1981

[51] Int. Cl.$^3$ ............................................. C30B 19/00
[52] U.S. Cl. ........................... 156/624; 156/DIG. 83
[58] Field of Search ................ 210/748; 156/602, 624, 156/622, 621, DIG. 83; 204/140

[56] References Cited

U.S. PATENT DOCUMENTS

| | | | |
|---|---|---|---|
| 2,842,467 | 7/1958 | Landauer et al. | 148/1.6 |
| 3,878,073 | 4/1975 | Boorstein et al. | 204/140 |
| 3,899,304 | 8/1975 | Linares | 23/301 SP |
| 4,186,045 | 1/1980 | Gatos et al. | 156/602 |

*Primary Examiner*—Hiram H. Bernstein
*Attorney, Agent, or Firm*—R. S. Sciascia; Charles D. B. Curry; William C. Daubenspeck

[57] ABSTRACT

A method for removing residual oxygen from a growth solution prior to liquid phase epitaxial crystal growth comprising the steps of disposing the materials in a containment vessel of a solid oxide electrolyte material under a protective atmosphere, heating the materials to form a liquid charge in the containment vessel, placing an electrode of an inert conducting solid in physical contact with the liquid charge, and applying a DC electric potential between the electrode and the containment vessel, the electrical contact to the containment vessel being made through a porous metallic coating of an inert metal on the outside surface of the containment vessel in the region where the liquid charge is contiguous to the inside surface of the containment vessel, the porous coating being relatively positive and the electrode being relatively negative.

11 Claims, 3 Drawing Figures

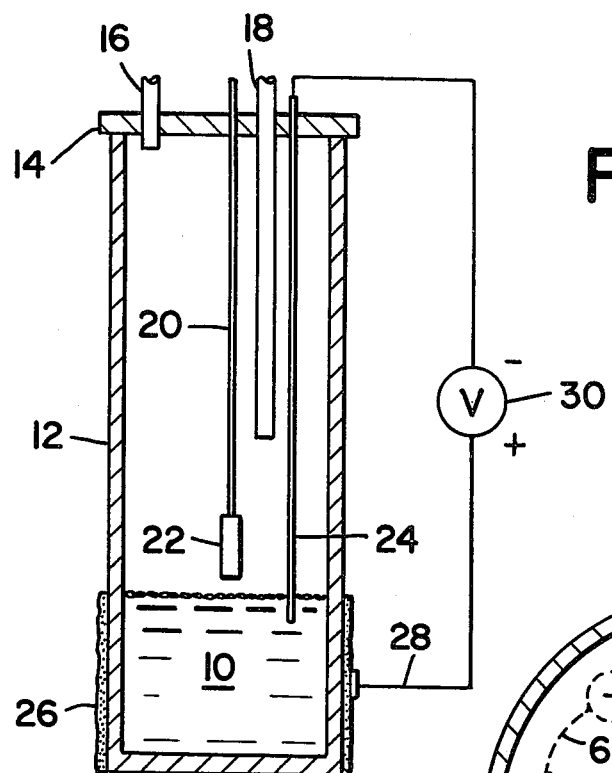
FIG_1
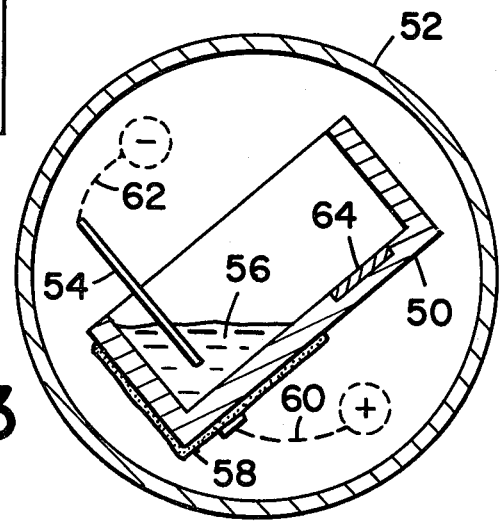
FIG_3
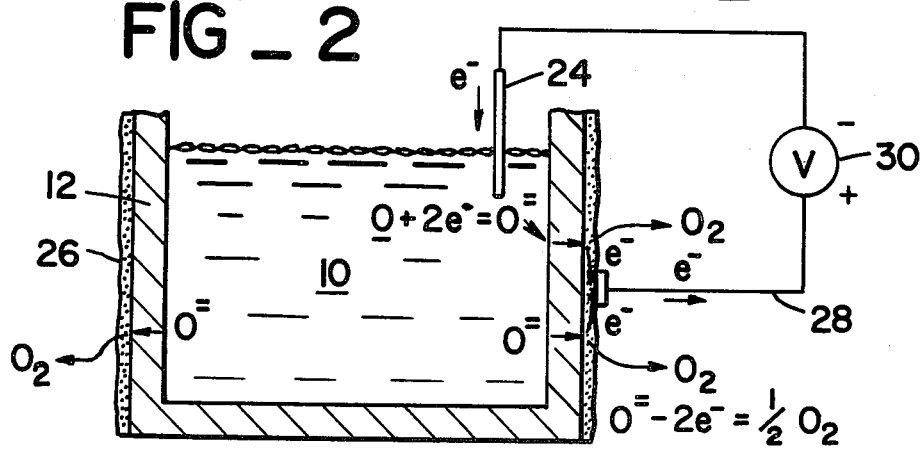
FIG_2

ELECTROCHEMICAL DEOXYGENATION FOR LIQUID PHASE EPITAXIAL GROWTH

BACKGROUND OF THE INVENTION

1. Field of the Invention

The invention relates in general to liquid phase epitaxial (LPE) crystal growth and, in particular, to apparatus and procedures which enable the removal of residual oxygen from the growth system prior to crystal growth.

2. Description of Prior Art

Liquid phase epitaxial deposition is one of the principal methods to manufacture compound semiconductors such as those in which an element of group III of the periodic table is reacted with an element of group V or an element of group II is reacted with an element of group VI. These compound semiconductors often have properties which make them attractive for use in electronic devices, particularly those which operate at high frequencies. However, the consistent preparation of high quality active layers has posed a serious limitation for use of these semiconductor compounds.

One of the most persistent problems has been the deoxygenation procedures that are used in the preparation of crystal layers by LPE growth. The importance of controlling oxygen levels in LPE growth has been well documented. Consider, for example, the III-V compound semiconductor gallium arsenide (GaAs), which has the unusual combination of a large band gap and a high electron mobility which make it particularly attractive for high frequency devices. There are reports that defects in GaAs crystals are substantially increased if a few parts per million (ppm) of oxygen are present in the LPE growth ambient and that there is a decrease in carrier mobility with increasing oxygen in the growth ambient. Most prior procedures for LPE growth have utilized an extended hydrogen anneal (approximately 20 hours) in the temperature range 600°-900° C. of the liquid gallium solvent prior to growth for the purpose of removing oxygen (and possibly sulfur) from the liquid gallium solvent. Properties, such as the carrier density, the carrier type, and the mobility, are profoundly influenced by the time and temperature of the anneal as well as the nature of the liquid gallium ambient during the anneal—for example, the purity of the hydrogen protective atmosphere and the materials in contact with the liquid gallium and hydrogen.

There is documentation of changes from n- to p-type conduction with increasing pregrowth annealing temperatures and of optimum annealing times in order to attain the highest mobilities. These observations suggest that there are beneficial and detrimental aspects of the pregrowth hydrogen anneal; the beneficial aspect concerns the removal of oxygen, a donor, from the gallium melt but with a concurrent contamination with C or Si acceptors. The existence of C- and Si-containing species at the ppm level in purified hydrogen has been confirmed using molecular beam mass spectrometry. During the long times required for the deoxygenation of the gallium melt with hydrogen, it is probable that C and Si acceptor impurities are incorporated as the oxygen donor is removed, thus explaining the n- to p-type conversion of the specimen.

SUMMARY OF THE INVENTION

It is therefore an object of the present invention to provide for removing residual oxygen impurities from LPE growth systems.

Another object of the present invention is to eliminate the need for a lengthy pregrowth anneal to remove residual oxygen impurities in LPE growth systems.

A further object of the present invention is to provide for the rapid removal of residual oxygen impurities from the liquid solution in LPE growth systems.

These and other objects are provided by the present invention in which the liquid growth solution (solvent and solute to be epitaxially deposited) is disposed under a protective atmosphere in a containment vessel of a solid oxide electrolyte material. A first electrode of an inert conducting solid is placed in electrical contact with the liquid solution and a porous coating of an appropriate metal (usually platinum) is fixed to the outside surface of the containment vessel opposite to the portion of the inside surface which is in contact with the liquid solution to form a second electrode. When an electrical potential is imposed between the two electrodes, oxygen dissolved in the liquid solution will be transported to the more positive electrode until a minimum value is obtained at the negative electrode as predicted by the Nernst equation. If the second electrode on the outside of the solid-oxide electrolyte containment vessel is the more positive, the dissolved oxygen in the solution will be transported to the container wall, pumped through the solid oxide electrolyte wall, and then released to the ambient atmosphere through the porous second electrode.

Other objects, advantages, and features of the present invention will become apparent from the following description of the preferred embodiment when considered in conjunction with the accompanying drawing wherein:

BRIEF DESCRIPTION OF THE DRAWING

FIG. 1 is a schematic representation of vertical LPE growth apparatus according to the present invention;

FIG. 2 illustrates the operation of the present invention in removing dissolved oxygen from the liquid solution; and FIG. 3 is a schematic representation of a tilt LPE growth apparatus according to the present invention.

DESCRIPTION OF THE PREFERRED EMBODIMENT

Referring now to FIG. 1, there is shown apparatus for employing the deoxygenation technique of the present invention in a vertical LPE growth procedure. As the apparatus required for LPE crystal growth is well known, the details of the conventional LPE process and apparatus have been included herein only to the extent they are thought to be necessary to the understanding of the present deoxygenation technique. In accordance with the present invention, the LPE solution 10, consisting of the material to be epitaxially deposited in solution with a solvent (such as gallium arsenide in gallium), is disposed in a vertical muffle tube 12 which is made from a solid oxide electrolyte material. Suitable oxides include stabilized zirconia, thoria, or ceria base electrolytes with additions of aliovalent oxides such as calcium oxide, yttrium oxide and scandium oxide. The muffle tube 12 is sealed by a cover 14 having a gas inlet 16 and a gas outlet 18 for providing an inert protective atmosphere such as purified argon within the tube. A vertical quartz rod 20 projects through the cover 14 and supports at its lower end a substrate 22 which provides the seed crystal for the epitaxial growth.

An electrode 24 of an inert conducting solid such as iridium is inserted through the cover 14 and extends within the tube 14 to make electrical contact with the melt 10 by insertion into the melt. A porous platinum coating 26 is applied to the outer surface of the solid oxide electrolyte muffle tube 12 in the region where the solution is in contact with the inner surface of the tube. A platinum lead wire 28 is attached to the platinum coating and a source of direct current voltage 30 is coupled between the lead wire 28 and the electrode 24, with the positive terminal being coupled to the platinum lead wire.

In operation, the application of a DC potential between the electrode 24 and the platinum coating 26 in effect creates a first electrode at the interface between liquid solution and the solid oxide electrolyte tube 12 and a second electrode at the interface between the solid oxide electrolyte tube and the platinum coating. When a potential is imposed between the two electrodes, dissolved oxygen will be transported from the more negative electrode to the more positive electrode until a minimum value is obtained at the negative electrode as predicted by the Nernst equation. On the inside of the muffle tube 12, as illustrated in FIG. 2, the relatively negative DC potential causes the dissolved oxygen molecules to be combined with two electrons to form negative oxygen ions (O (dissolved)+2e=O=) which are transported to the inside wall of the solid oxide electrolyte muffle tube. The negative oxygen ions are then transported through the muffle tube 12 by the DC potential which should be as high as possible without decomposing or altering the properties of the solid oxide electrolytes. At the outside wall of the tube 12, the excess electrons are conducted away from the negative oxygen ions to form oxygen gas (O=−2e=½O₂) which passes through the porous electrode coating 26 to the external atmosphere. After a suitable period of time to allow the dissolved oxygen to reach a minimum value (as predicted by the Nernst equation), a conventional LPE growth procedure may be initiated.

Although the present invention has been described in connection with a vertical LPE growth system, it should be apparent that the oxygen removal technique of the present invention is suitable for use in horizontal LPE growth apparatus such as tilt systems and slider systems. For example, FIG. 3 represents a tilt system in which a crucible 50 formed of a solid oxide electrolyte material is disposed in a quartz muffle tube 52 under an inert protective atmosphere. A first electrode 54 of an inert conducting solid is disposed to make direct electrical contact with the liquid solution 56 when the system is in the pregrowth orientation as shown in FIG. 3. A porous coating 58 of an appropriate metal, such as platinum, forming a second electrode is affixed to the outside surface of the crucible 50 in the region where the liquid solution 56 is contiguous to the inside surface of the crucible. The application of a DC potential as represented by dashed lines 60 and 62 between the electrodes 54 and 58 will transport the dissolved oxygen molecules in the solution 56 to the relatively positive electrode in the same manner as previously described until a minimum value is obtained at the relatively negative electrode, with the negative oxygen ions arriving at the more positive electrode being released into the ambient atmosphere. The normal LPE process may then be initiated in which the crucible 50 is tilted so that the solution 52 is brought in contact with a seed crystal 64.

The present invention has been described with particular reference to an LPE growth process or gallium in gallium arsenide; however, it should be apparent that the electrochemical deoxygenation process is applicable for use with other materials. For example, the present invention may be used in the deoxygenation of solvents such as cadmium, zinc, or mercury in the LPE growth of II–VI compound semiconductors or indium in the LPE growth of III–V compound semiconductors.

What is claimed is:

1. In a liquid phase epitaxial growth process of the type wherein a compound semiconductor material to be epitaxially deposited is dissolved in a solvent for said semiconductor material prior to the epitaxial growth of a semiconductor crystal, the improvement being a method for removing residual oxygen from a charge of said semiconductor material and said solvent, said improvement comprising the steps of:
   (a) disposing said charge in a containment vessel of a solid-oxide electrolyte material under an inert protective atmosphere;
   (b) heating said charge to at least the temperature where said compound semiconductor material is dissolved in said solvent and maintaining said temperature to form a liquid charge in said containment vessel;
   (c) placing an electrode of an inert conducting solid in physical contact with said liquid charge; and
   (d) applying an electric potential between said electrode and said containment vessel, the electrical contact to said containment vessel being made through a porous metallic coating on the outside surface of said containment vessel in the region where said liquid charge is contiguous to the outside surface of said containment vessel, said porous coating being relatively positive and said electrode being relatively negative, whereby said residual oxygen will be transported from the more negative potential to the more positive potential until a minimum value is obtained at the more negative electrode, the oxygen passing through the wall of the containment vessel and the porous coating.

2. The method as recited in claim 1 wherein said compound semiconductor material is gallium arsenide and said solvent is gallium.

3. The method as recited in claim 1 wherein said solvent is cadmium.

4. The method as recited in claim 1 wherein said solvent is zinc.

5. The method as recited in claim 1 wherein said solvent is mercury.

6. The method as recited in claim 1 wherein said solvent is indium.

7. The method as recited in claim 1 wherein said porous metallic coating is a coating of an inert metal.

8. The method as recited in calim 1 wherein said solid-oxide electrolyte material is chosen from the group consisting of zirconia, thoria, and ceria based electrolytes with additions of aliovalent oxides.

9. The method as recited in claim 1 wherein said aliovalent oxides are chosen from the group consisting of calcium, oxide, yttrium oxide and scandium oxide.

10. The method as recited in claim 1 wherein said electrode of an inert conducting solid is of iridium.

11. The method as recited in claim 1 wherein said metallic coating is a coating of platinum.

* * * * *